(12) United States Patent
Hirano et al.

(10) Patent No.: US 11,519,940 B2
(45) Date of Patent: Dec. 6, 2022

(54) CURRENT SENSOR

(71) Applicant: TDK Corporation, Tokyo (JP)

(72) Inventors: Hiroyuki Hirano, Tokyo (JP); Makoto Takahashi, Tokyo (JP); Ryoichi Menju, Tokyo (JP); Teiichiro Oka, Tokyo (JP)

(73) Assignee: TDK Corporation, Tokyo (JP)

( * ) Notice: Subject to any disclaimer, the term of this patent is extended or adjusted under 35 U.S.C. 154(b) by 8 days.

(21) Appl. No.: 17/155,527

(22) Filed: Jan. 22, 2021

(65) Prior Publication Data
US 2021/0263077 A1  Aug. 26, 2021

(30) Foreign Application Priority Data
Feb. 21, 2020 (JP) .............................. JP2020-028577

(51) Int. Cl.
*G01R 15/20* (2006.01)
*G01R 19/00* (2006.01)

(52) U.S. Cl.
CPC ......... *G01R 15/202* (2013.01); *G01R 15/205* (2013.01); *G01R 19/0092* (2013.01)

(58) Field of Classification Search
CPC .. G01R 15/202; G01R 15/205; G01R 15/207; G01R 15/20; G01R 19/0092
See application file for complete search history.

(56) References Cited

U.S. PATENT DOCUMENTS

| | | | |
|---|---|---|---|
| 2007/0164727 A1* | 7/2007 | Racz | G01R 15/207 324/235 |
| 2013/0335076 A1* | 12/2013 | Sakamoto | G01R 19/00 324/244 |
| 2014/0232376 A1* | 8/2014 | Yasui | G01R 15/207 324/127 |
| 2015/0042325 A1* | 2/2015 | Snoeij | G01R 15/20 324/251 |
| 2017/0219634 A1* | 8/2017 | Shimizu | G01R 33/091 |
| 2018/0038898 A1* | 2/2018 | Shimizu | G01R 15/20 |
| 2019/0154735 A1* | 5/2019 | Shimizu | G01R 19/32 |

FOREIGN PATENT DOCUMENTS

JP  2013228315 A  11/2013

* cited by examiner

*Primary Examiner* — Dominic E Hawkins
(74) *Attorney, Agent, or Firm* — Posz Law Group, PLC (57) ABSTRACT

A current sensor that is less affected by the residual magnetization is provided. A current sensor of the present invention has a magnetic circuit that is magnetized by electric current; a first magnetic field detecting element that is positioned where a magnetic field, when the electric current is present, is directed in a same direction as a magnetic field that is caused by residual magnetization of the magnetic circuit when the electric current is not present; and a second magnetic field detecting element that is positioned where a magnetic field, when the electric current is present, is directed opposite to a direction of a magnetic field that is caused by residual magnetization of the magnetic circuit when the electric current is not present.

20 Claims, 12 Drawing Sheets

CURRENT SENSOR

BACKGROUND OF THE INVENTION

1. Field of the Invention

The present application is based on, and claims priority from, JP2020-28577, filed on Feb. 21, 2020, the disclosure of which is hereby incorporated by reference herein in its entirety.

The present invention relates to a current sensor.

2. Description of the Related Art

A current sensor is known that measures electric current that flows in a current line by detecting a magnetic field that is induced by the electric current. JP2013-228315 discloses a current sensor having an open main core that surrounds a busbar (a current line) and a sub-core that is arranged outside of the main core and that is adjacent to the open ends of the main core. A magnetic field detecting element is disposed between the open ends of the main core. The main core is provided to collect magnetic flux. Since the main core is made of a magnetic material, residual magnetization occurs when current does not flow in the current line. The magnetic field detecting element detects a magnetic field that is caused by the residual magnetization when current does not flow. This magnetic field is one of the causes of measurement error because the magnetic field is not generated by electric current that flows in the current line. However, residual magnetization occurs in the sub-core in a direction opposite to the residual magnetization in the main core. Therefore, the magnetic field that is caused by the residual magnetization of the sub-core weakens the magnetic field that is caused by the residual magnetization of the main core, and the influence of the residual magnetization of the main core is reduced.

SUMMARY OF THE INVENTION

In the current sensor disclosed in JP2013-228315, the area where the residual magnetization of the sub-core weakens the residual magnetization of the main core is limited. Therefore, the arrangement of the magnetic field detecting element is significantly limited.

The present invention aims at providing a current sensor that is less affected by the residual magnetization.

A current sensor of the present invention comprises a magnetic circuit that is magnetized by electric current; a first magnetic field detecting element that is positioned where a magnetic field, when the electric current is present, is directed in a same direction as a magnetic field that is caused by residual magnetization of the magnetic circuit when the electric current is not present; and a second magnetic field detecting element that is positioned where a magnetic field, when the electric current is present, is directed opposite to a direction of a magnetic field that is caused by residual magnetization of the magnetic circuit when the electric current is not present.

According to the present invention, it is possible to provide a current sensor that is less affected by the residual magnetization.

The above and other objects, features and advantages of the present invention will become apparent from the following description with reference to the accompanying drawings which illustrate examples of the present invention.

DETAILED DESCRIPTION OF THE INVENTION

With reference to the drawings, several embodiments of current sensor 1A to 1J of the present invention will be described. In the description below, the direction along which current lines 2A, 2B extend is referred to as the X direction, the direction along which a normal line, that is drawn from the center axis of current lines 2A, 2B to the center of first magnetic field detecting element 5, extends is referred to as the Z direction, and the direction perpendicular both to the X direction and to the Z direction is referred to as the Y direction. When the current line is a busbar, the Y direction is parallel to the width direction of the busbar. In each drawing, the direction of a magnetic field that is applied to first magnetic field detecting element 5 when current flows in current lines 2A, 2B is referred to as the +Y direction, and the opposite direction is the −Y direction. The current sensor of the present invention is configured to measure the electric current that flows in current lines 2A, 2B, and current lines 2A, 2B themselves are not included in the current sensor. However, it is possible to incorporate the current line near the current sensor as a part of the current sensor. Current lines 2A, 2B are examples of a region where electric current flows, and in the following embodiments, a current line is used as an example, but the region where electric current flows is not limited to a current line, and any continuous conductor may be used.

First Embodiment

Figure 1A:
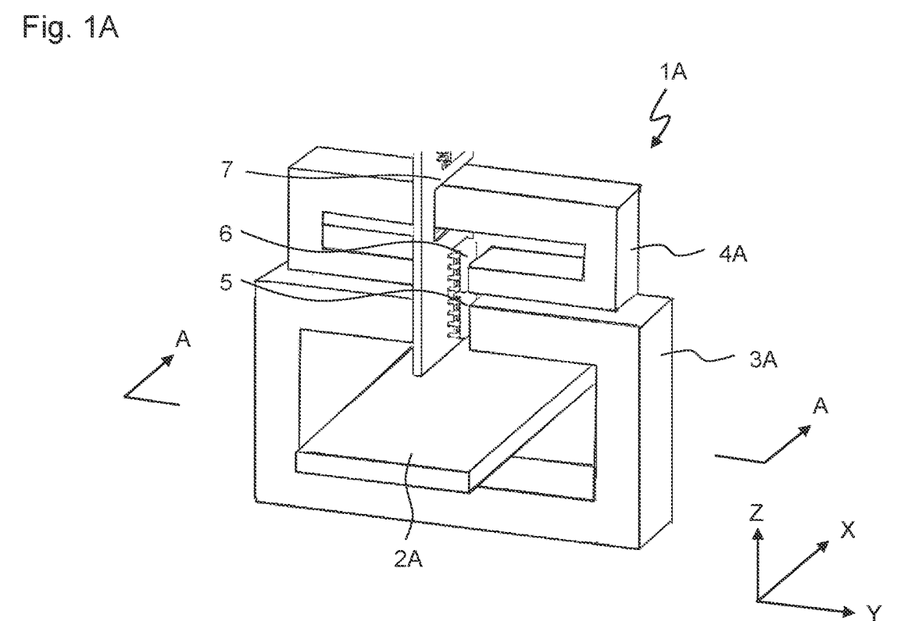
FIGS. 1A to 1B are schematic views of a current sensor according to a first embodiment.
Figure 1B:
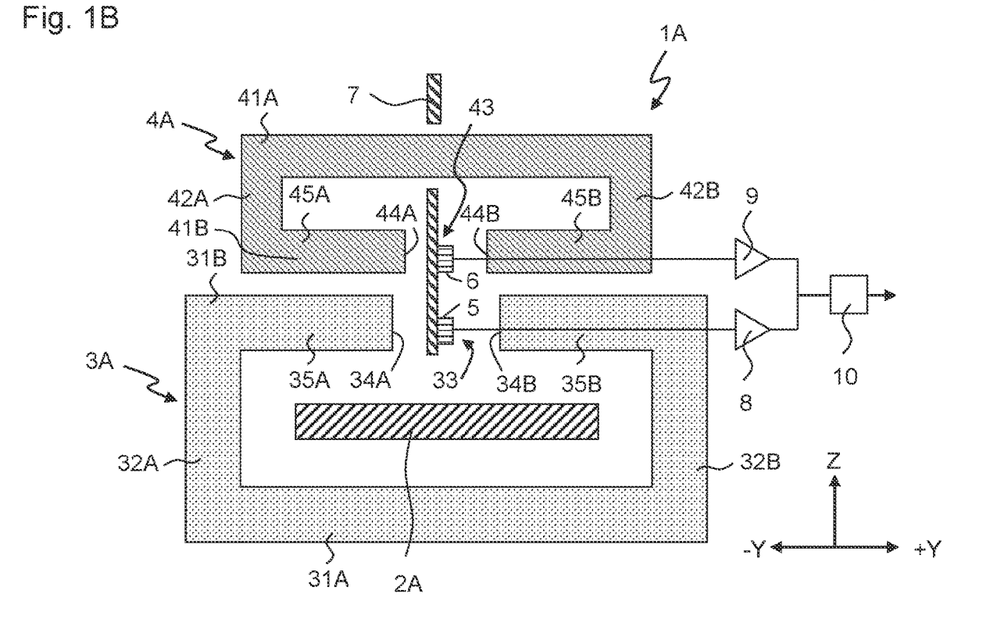

FIG. 1A is a perspective view of current sensor 1A according to the first embodiment, and FIG. 1B is a section view taken along line A-A in FIG. 1A. Current sensor 1A has first magnetic circuit 3A that surrounds current line 2A and second magnetic circuit 4A that is positioned outside of current line 2A. First magnetic circuit 3A and second magnetic circuit 4A are positioned in the same plane (the Y-Z plane) that is perpendicular to the X direction. First magnetic circuit 3A and second magnetic circuit 4A are magnetic circuits, each consisting of a core that is made of a soft magnetic material, such as NiFe. Current line 2A is a plate-like busbar having a rectangular section. Current sensor 1A is used, for example, to measure electric current that flows in a busbar that is connected to a battery, but the arrangement and type of current line 2A is not limited.

First magnetic circuit 3A has a rectangular shape having a pair of long sides 31A, 31B that extend in the Y direction and a pair of short sides 32A, 32B that extend in the Z direction and that are perpendicular to long sides 31A, 31B, as viewed in the X direction. First magnetic circuit 3A is an open magnetic circuit that surrounds current line 2A. Void portion 33 is provided at the center of one of the long sides (long side 31B), and open end 34A, 34B of first magnetic circuit 3A are positioned on both sides of void portion 33. The remaining part of long side 31B that has void portion 33 forms both end regions 35A, 35B of first magnetic circuit 3A. Second magnetic circuit 4A is provided adjacent to first magnetic circuit 3A in the Z direction. Second magnetic circuit 4A is positioned outside of current line 2A and does not surround current line 2A. Like first magnetic circuit 3A, second magnetic circuit 4A has a rectangular shape having a pair of long sides 41A, 41B that extend in the Y direction and a pair of short sides 42A, 42B that extend in the Z direction. Second magnetic circuit 4A is also an open magnetic circuit. Void portion 43 is provided at the center of one of the long sides (long sides 41B), and open ends 44A, 44B of second magnetic circuit 4A are positioned on both sides of void portion 43. The remaining part of long side 41B having void portion 43 forms both end regions 45A, 45B of second magnetic circuit 4A. Void portion 43 of second magnetic circuit 4A faces void portion 33 of first magnetic circuit 3. Both end regions 45A, 45B of second magnetic circuit 4A extend in the Y direction along both end regions 35A, 35B of first magnetic circuit 3A. Due to this arrangement, second magnetic circuit 4A is easily magnetized by first magnetic circuit 3A.

First magnetic field detecting element 5 is disposed in void portion 33 of first magnetic circuit 3A, i.e., between both open ends 34A, 34B. Second magnetic field detecting element 6 is disposed in void portion 43 of second magnetic circuit 4A, i.e., between both open ends 44A, 44B. First and second magnetic field detecting elements 5, 6 are Hall elements, but may be magneto-resistive elements, such as AMR elements, TMR elements and GMR elements. The direction in which first field detecting element 5 senses a magnetic field and the direction in which second magnetic field detecting element 6 senses a magnetic field are the Y direction, and they are parallel to each other. Specifically, first magnetic field detecting element 5 detects a magnetic field that connects both open ends of 34A, 34B of first magnetic circuit 3A in the Y direction, and second magnetic field detecting element 6 detects a magnetic field that connects both open ends 44A, 44B of second magnetic circuit 4A in the Y direction. The output of first magnetic field detecting element 5 and the output of second magnetic field detecting element 6 have the same polarity. Specifically, when a magnetic field is applied to first magnetic field detecting element 5 and second magnetic field detecting element 6 in the same direction, the sign of the output of first magnetic field detecting element 5 is the same as the sign of the output of second magnetic field detecting element 6. First magnetic field detecting element 5 and second magnetic field detecting element 6 are positioned on the same side of current line 2A and are mounted on common substrate 7. Therefore, the process of assembling current sensor 1A is simplified.

Current sensor 1A has first amplifier 8 that is connected to first magnetic field detecting element 5, second amplifier 9 that is connected to second magnetic field detecting element 6 and adder 10 that is connected both to first amplifier 8 and to second amplifier 9. First amplifier 8, second amplifier 9 and adder 10 are disposed on substrate 7. First amplifier 8 amplifies the output of first magnetic field detecting element 5, and second amplifier 9 amplifies the output of second magnetic field detecting element 6. Adder 10 generates a sum of the output of first amplifier 8 and the output of second amplifier 9. Current sensor 1A outputs the output of adder 10 to the outside of current sensor 1A.

Figure 2A:
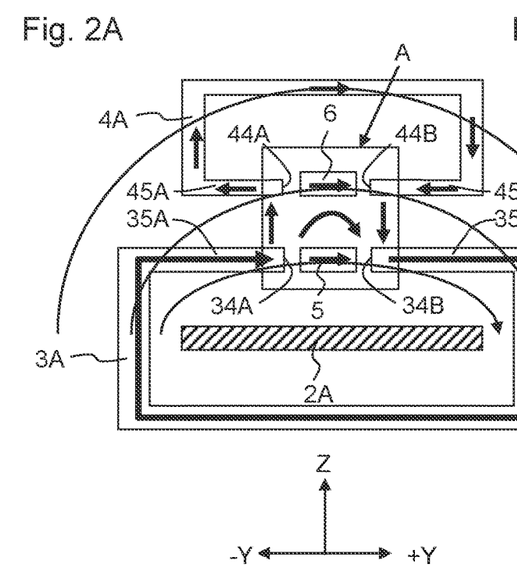
FIGS. 2A to 2D are conceptual views illustrating an external magnetic field that is applied to the current sensor shown in FIGS. 1A to 1B.
Figure 2B:
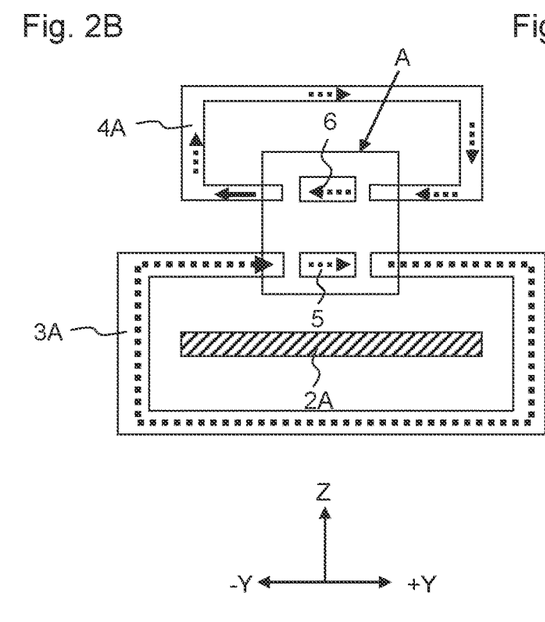
Figure 2C:
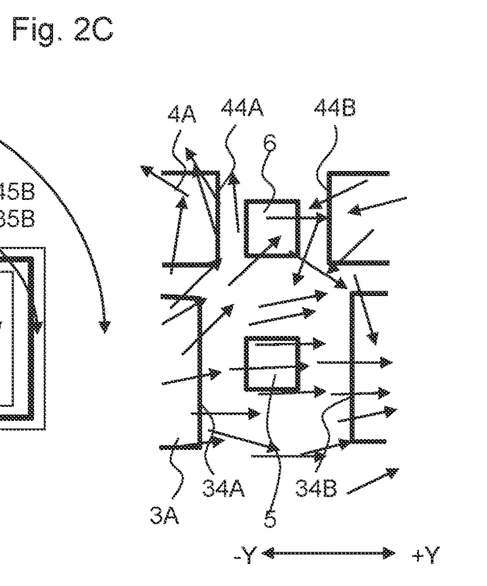
Figure 2D:
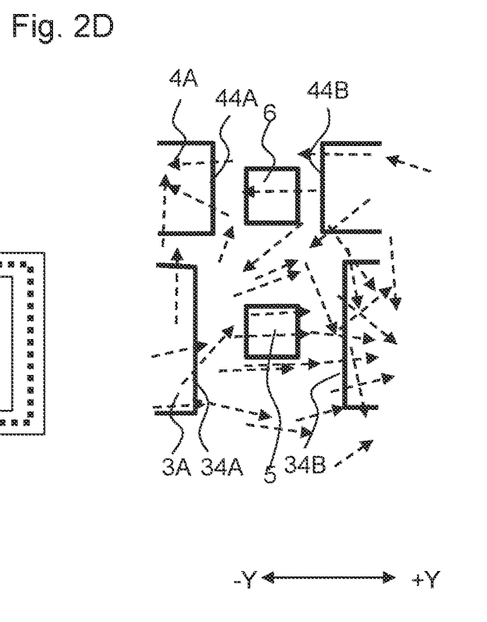

FIG. 2A and FIG. 2B conceptually illustrate an external magnetic field that is applied to current sensor 1A when current flows in current line 2A and when current does not flow in current line 2A, respectively. FIG. 2C and FIG. 2D show enlarged views of portion A in FIG. 2A and FIG. 2B, respectively. FIG. 2C and FIG. 2D are based on simulation. As shown by the solid lines in FIG. 2A, a clockwise magnetic flux is generated around current line 2A when current flows in current line 2A. Since first magnetic circuit 3A has a shape that conforms to magnetic flux that is generated by current line 2A, first magnetic circuit 3A is magnetized clockwise, as illustrated, and can collect magnetic flux. As shown in FIG. 2C, due to the magnetic field that is generated by current line 2A and the magnetic field that is generated by first magnetic circuit 3A, a strong magnetic field is generated in the +Y direction between both open ends 34A, 34B of first magnetic circuit 3A. Now assume that the output of first magnetic field detecting element 5 in this state is positive. As shown in FIG. 2A, a part of the magnetic flux that exits left end region 35A of first magnetic circuit 3A is sucked by left end region 45A of second magnetic circuit 4A, further progresses clockwise along second magnetic circuit 4A and is sucked by right end region 35A of first magnetic circuit 3A from right end region 45. As shown in FIG. 2C, instead of a magnetic field that is directed in the −Y direction from right open end 44B to left open end 44A, a magnetic field that is directed in the +Y direction from left open end 44A to right open end 44B is generally applied to the area between both open ends 44A, 44B of second magnetic circuit 4A. In other words, second magnetic circuit 4A is magnetized clockwise, but due to the influence of first magnetic circuit 3A, a magnetic field that is directed in the same direction as the magnetic field between both open ends 34A, 34B is generated between both open ends 44A, 44B. As a result, the output of second magnetic field detecting element 6 is also positive.

As shown by the dashed line in FIG. 2B, when current does not flow in current line 2A, that is, when the electric current is lost in current line 2A, residual magnetization is generated in first and second magnetic circuits 3, 4. The direction of the residual magnetization of first and second magnetic circuits 3, 4 coincides with the magnetization direction of first and second magnetic circuits 3, 4 when current flows. As a result, a magnetic field is generated in the +Y direction between both open ends 34A, 34B of first magnetic circuit 3A, and the output of first magnetic field detecting element 5 is still positive. On the other hand, between both open ends 44A, 44B of second magnetic circuit 4A, a magnetic field is generated in the −Y direction, and the output of second magnetic field detecting element 6 becomes negative. This is because the influence of the magnetic field that is generated by current line 2A is lost. That is, the output of first magnetic field detecting element 5 between both open ends 34A, 34B of first magnetic circuit 3A that surrounds current line 2A is positive both when current flows and when current does not flow, while the output of second magnetic field detecting element 6 between both open ends 44A, 44B of second magnetic circuit 4A that is positioned outside of current line 2A is positive when current flows and is negative when current does not flow. This is because, in essence, first magnetic field detecting element 5 and second magnetic field detecting element 6 are positioned on the same side of current line 2A.

As described above, when current does not flow, the magnetic field that is detected by first magnetic field detecting element 5 and the magnetic field that is detected by second magnetic field detecting element 6 have different directions (signs). Therefore, when current does not flow, by obtaining the sum of the output of first magnetic field detecting element 5 and the output of second magnetic field detecting element 6, the hysteresis that is caused by the residual magnetization of first and second magnetic circuits 3, 4 can be cancelled out or reduced. On the other hand, when current flows, the magnetic field that is detected by first magnetic field detecting element 5 and the magnetic field that is detected by second magnetic field detecting element 6 have the same direction (sign). Therefore, by obtaining the sum of the output of first magnetic field detecting element 5 and the output of second magnetic field detecting element 6, the output can be increased. Accordingly, current sensor 1A of the present embodiment is less affected by hysteresis while the S/N ratio is improved.

Figure 3A:
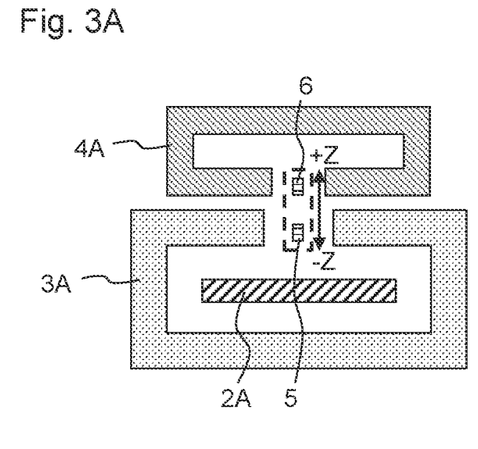
FIG. 3A is a view showing the positions of the first and second magnetic field detecting elements in the first embodiment.
Figure 3B:
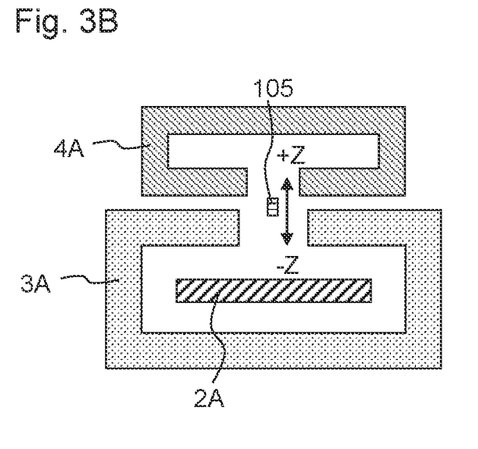
FIG. 3B is a view showing the position of a magnetic field detecting element in a comparative example.
Figure 3C:
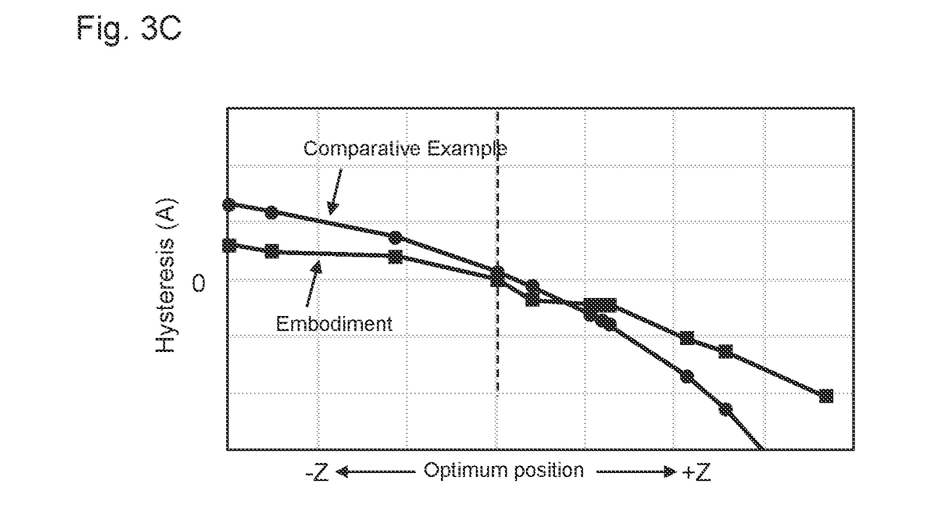
FIG. 3C is a graph showing the relationship between the position of the magnetic field detecting element and hysteresis.

FIGS. 3A to 3C Illustrates the influence of the position of the magnetic field detecting elements on hysteresis. As shown in FIG. 3A, the hysteresis was measured for first and second magnetic field detecting elements 5, 6 of the present embodiment that are provided at various positions in the Z direction. The gap between first magnetic field detecting element 5 and second magnetic field detecting element 6 in the Z direction is constant. In a comparative example, as shown in FIG. 3B, the hysteresis was measured for magnetic field detecting element 105 that is provided at various positions in the Z direction. In the comparative example, one magnetic field detecting element 105 is provided between first magnetic field detecting element 5 and second magnetic field detecting element 6. The hysteresis was calculated as [the density of the residual magnetic flux / the density of the detected magnetic flux]×maximum measured electric current (A). In FIG. 3C, the horizontal axis is the position of the magnetic field detecting elements in the Z direction, and the vertical axis is the hysteresis (in the present embodiment, the sum of hysteresis of first magnetic field detecting element 5 and hysteresis of second magnetic field detecting element 6 at the positions in the Z direction). In the present embodiment, the sum of the output of first magnetic field detecting element 5 and the output of second magnetic field detecting element 6 when current does not flow is zero at the optimum position. In the comparative example, the output of the magnetic field detecting element when current does not flow is zero at the optimum position. As the distance between the positions of the magnetic field detecting elements and the optimum position increases in the Z direction, the density of the residual magnetic flux increases, and the hysteresis increases.

In the present embodiment, the change of the hysteresis is relatively small, as compared to the change of the positions of first and second magnetic field detecting elements 5, 6 in the Z direction. On the other hand, in the comparative example, the change of the hysteresis is relatively large, as compared to the change of the position of magnetic field detecting element 105 in the Z direction. This means that the present embodiment allows a wide range for the positions of first and second magnetic field detecting elements 5, 6 in the Z direction. In the comparative example, the range having small hysteresis is limited. Therefore, the shapes, positional relationship and so on of first and second magnetic circuits 3, 4 need to be optimized such that the residual magnetic flux becomes as close to zero as possible in the area where magnetic field detecting element 105 is disposed. On the other hand, the need for such optimization is small in the present embodiment. In addition, in the present embodiment, even if the absolute value of the output of first magnetic field detecting element 5 is not the same as the absolute value of the output of second magnetic field detecting element 6 when current does not flow, the output of first magnetic field detecting element 5 and the output of second magnetic field detecting element 6 can be easily cancelled out by adjusting the gains of first amplifier 8 and second amplifier 9. Specifically, the gains of first amplifier 8 and second amplifier 9 may be set such that the absolute value of the output of first amplifier 8 when current does not flow and the absolute value of the output of second amplifier 9 when current does not flow are about the same level. In the present embodiment, when the shapes, positional relationship and so on of first and second magnetic circuits 3, 4 are determined, it is not necessary to consider the hysteresis as an important factor. In the comparative example, it is, in principle, impossible to reduce the hysteresis by adjusting the gain of the amplifier.

As a modification of the present embodiment, the output of first magnetic field detecting element 5 and the output of second magnetic field detecting element 6 may have different polarities. Specifically, when a magnetic field is applied to first magnetic field detecting element 5 and second magnetic field detecting element 6 in the same direction, the output of first magnetic field detecting element 5 and the output of second magnetic field detecting element 6 have different signs. In case of a Hall element, electric current that is applied to first magnetic field detecting element 5 and electric current that is applied to second magnetic field detecting element 6 may be directed in opposite directions. As a result, a positively charged surface is changed to a negatively charged surface (and vice versa), and the sign of the output can be reversed. In case of a magneto-resistive element, the magnetization pinned layer of first magnetic field detecting element 5 and the magnetization pinned layer of second magnetic field detecting element 6 may be magnetized in opposite directions. By reversing the polarity of the output of first magnetic field detecting element 5 or the output of second magnetic field detecting element 6, the sign of the output of first magnetic field detecting element 5 and the sign of the output of second magnetic field detecting element 6 are different from each other when current flows, and coincide with each other when current does not flow. Therefore, in the present modification, by providing means for obtaining a difference between the output of first magnetic field detecting element 5 and the output of second magnetic field detecting element 6, such as a subtractor, the same effect as the above-described embodiment can be achieved.

Figure 4A:
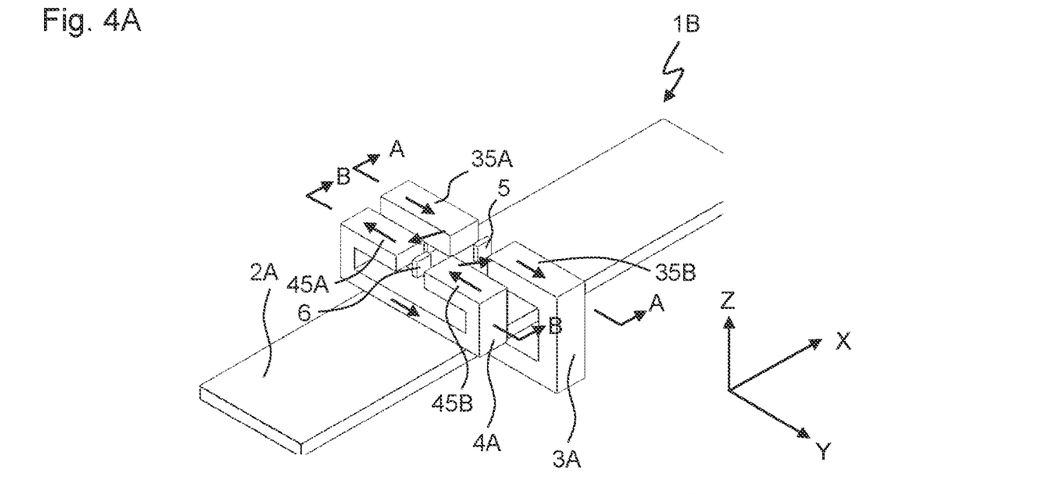
FIGS. 4A to 4C are schematic views of a current sensor according to a modification of the first embodiment.
Figure 4B:
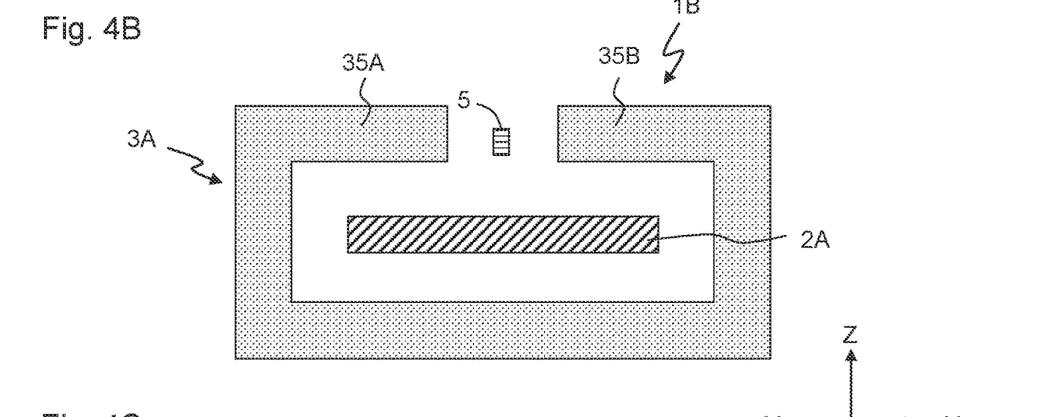
Figure 4C:
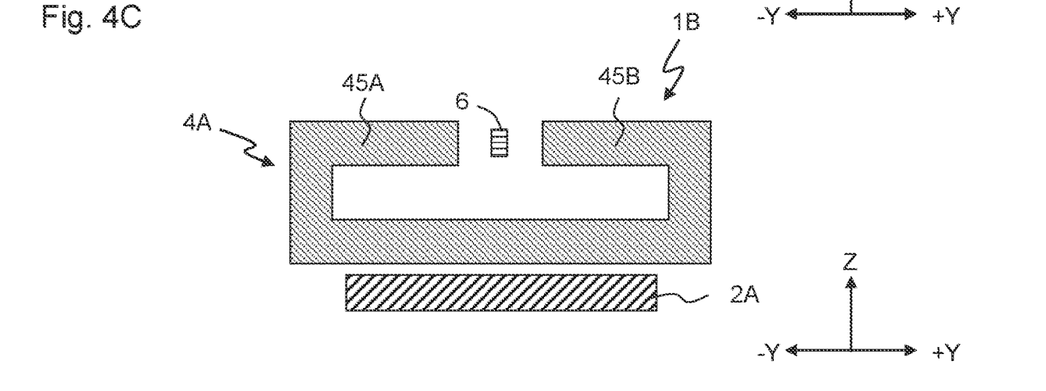

FIGS. 4A to 4C show another modification of the present embodiment. FIG. 4A is a perspective view of current sensor 1B according to the present modification, FIG. 4B is a section view taken along line A-A in FIG. 4A, and FIG. 4C is a section view taken along line B-B in FIG. 4A. First magnetic circuit 3A and second magnetic circuit 4A are aligned in the X direction. Specifically, first magnetic circuit 3A and second magnetic circuit 4A are positioned in different Y-Z planes that are perpendicular to the X direction. First magnetic circuit 3A surrounds current line 2A, and second magnetic circuit 4A is positioned outside of current line 2A. In the present modification, first and second magnetic circuits 3, 4 are magnetized in the same manner as the embodiment described above. As shown in FIG. 4A, when current flows, magnetic flux flows in the X direction from end region 35A of first magnetic circuit 3A to end region 45A of second magnetic circuit 4A, and flows in the X direction from opposite end region 45B of second magnetic circuit 4A to end region 35B of first magnetic circuit 3. The magnetic flux flows in second magnetic circuit 4A in the same manner as the embodiment described above. Therefore, the magnetic field between both open ends 44A, 44B of second magnetic circuit 4 is directed in opposite directions when current flows and when current does not flow. According to the present modification, the dimension of current sensor 1B in the Z direction can be limited.

Figure 5A:
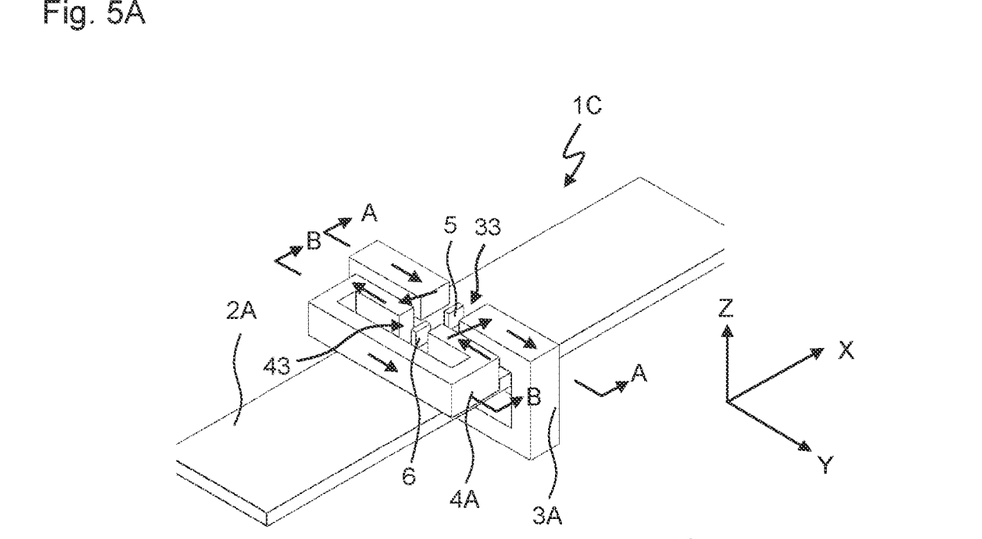
FIGS. 5A to 5C are schematic views of a current sensor according to a modification of the first embodiment.
Figure 5B:
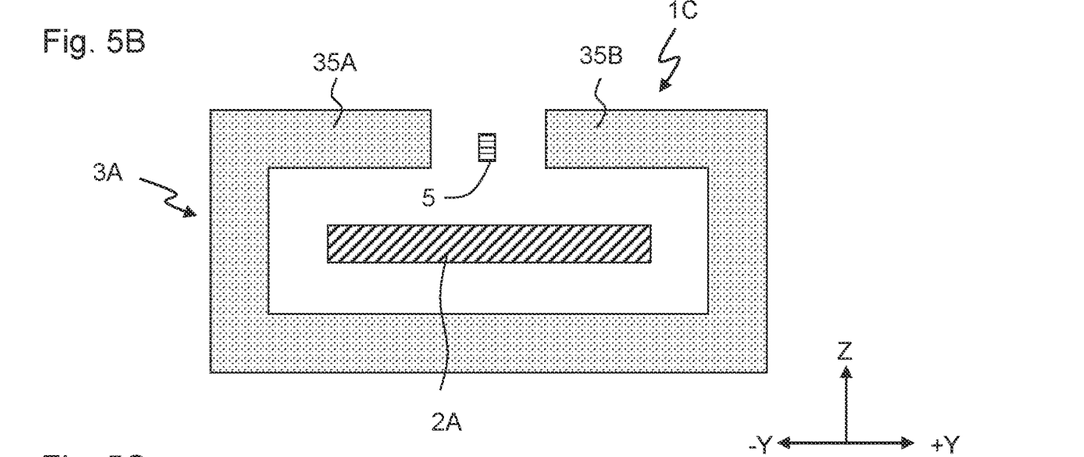
Figure 5C:
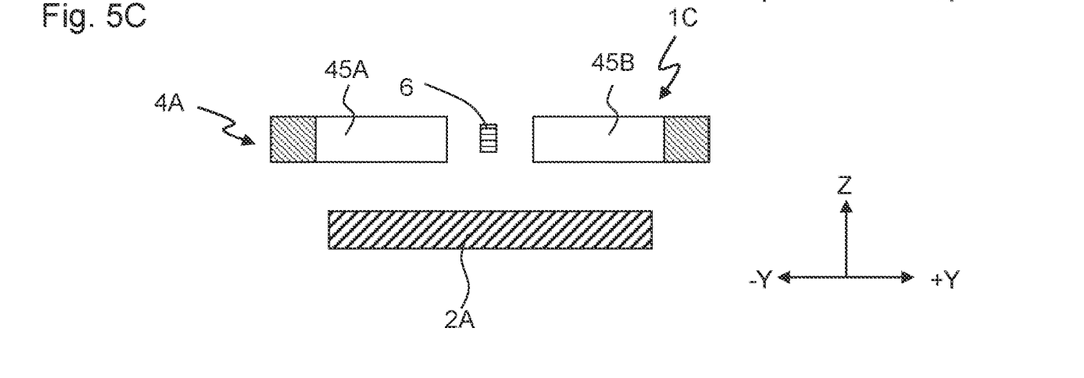

FIGS. 5A to 5C show another modification of the present embodiment. FIG. 5A a perspective view of current sensor 1C according to the present modification, FIG. 5B is a section view taken along line A-A in FIG. 5A, and FIG. 5C a section view taken along line B-B in FIG. 5A. First magnetic circuit 3A is positioned in a Y-Z plane that is perpendicular to the X direction, and second magnetic circuit 4A is positioned in a X-Y plane that is parallel to the X direction. Since void portion 33 of first magnetic circuit 3A and void portion 43 of second magnetic circuit 4A face each other, first magnetic field detecting element 5 and second magnetic field detecting element 6 can be mounted on common substrate 7. In the present modification, the magnetic flux flows in second magnetic circuit 4A in the same manner as the embodiments described above, and the same effect as the embodiments described above can be achieved.

Figure 6A:
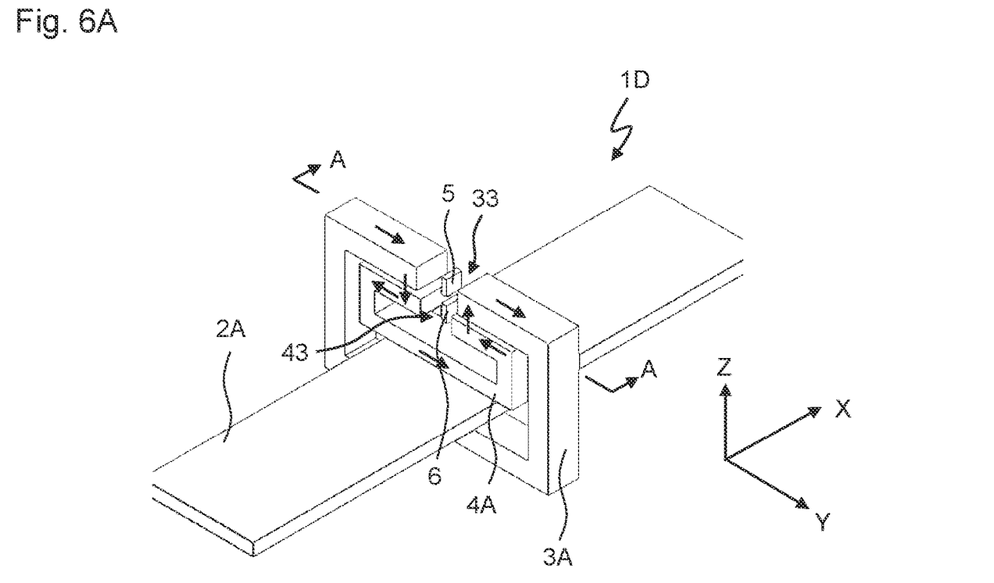
FIGS. 6A to 6B are schematic views of a current sensor according to a modification of the first embodiment.
Figure 6B:
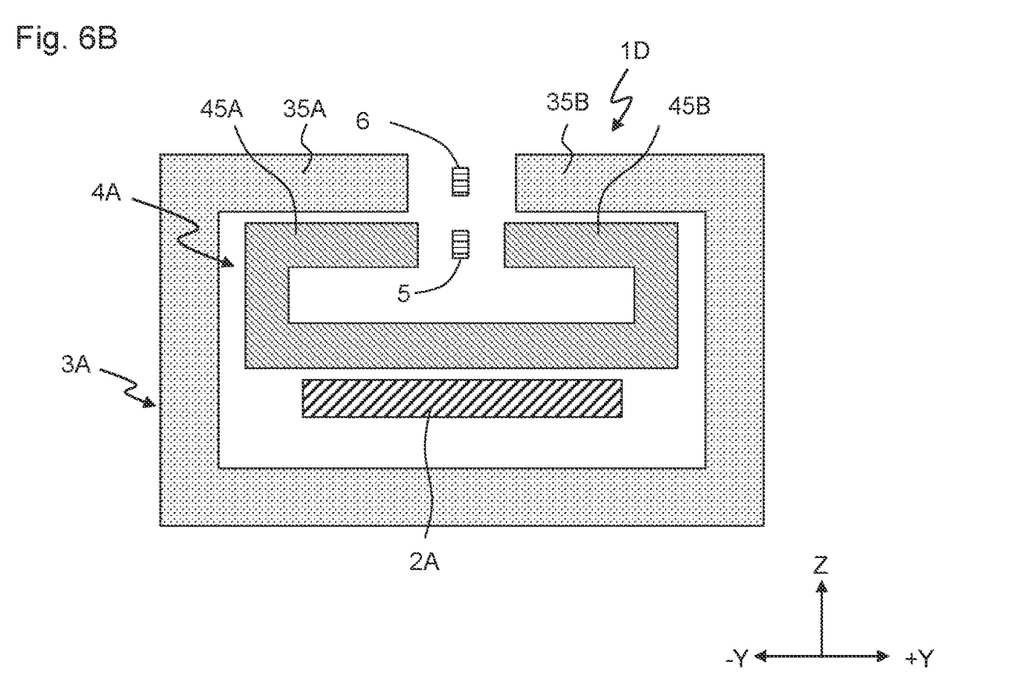

FIGS. 6A to 6B show another modification of the present embodiment. FIG. 6A is a perspective view of current sensor 1D according to the present modification, and FIG. 6B is a section view taken along line A-A in FIG. 6A. First magnetic circuit 3A and second magnetic circuit 4A are positioned in the same plane that is perpendicular to the direction in which current line 2A extends. Second magnetic circuit 4A is positioned inside of first magnetic circuit 3A. Since void portion 33 of first magnetic circuit 3A and void portion 43 of second magnetic circuit 4A face each other, first magnetic field detecting element 5 and second magnetic field detecting element 6 can be mounted on common substrate 7. In the present modification, magnetic flux flows in second magnetic circuit 4A in the same manner as the embodiments described above, and the same effect as the embodiments described above can be achieved.

Figure 7A:
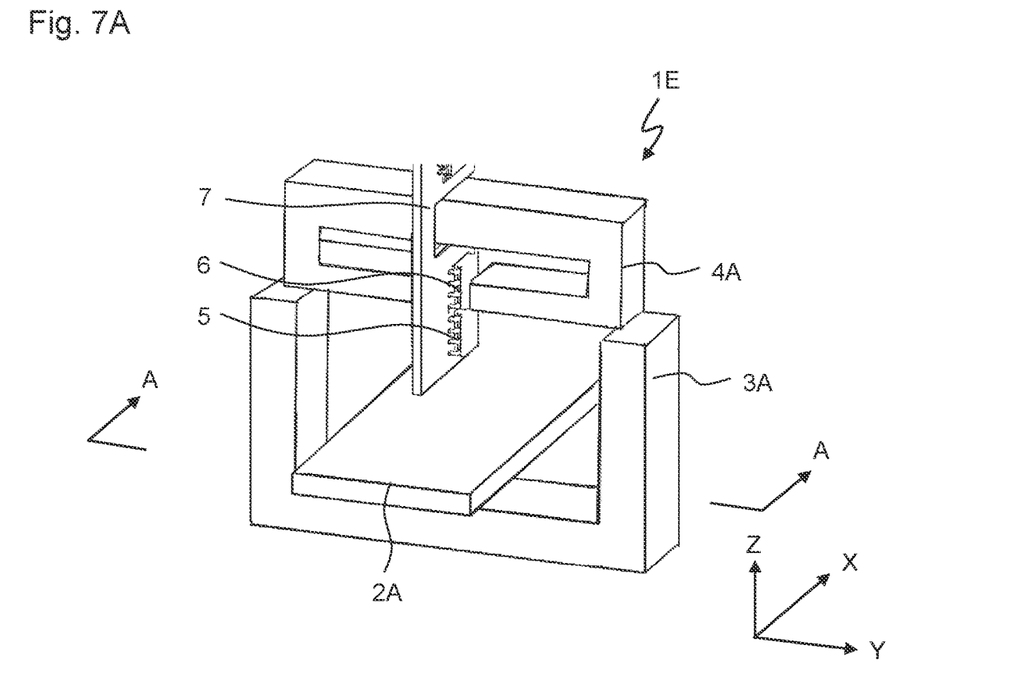
FIGS. 7A to 7B are schematic views of a current sensor according to a modification of the first embodiment.
Figure 7B:
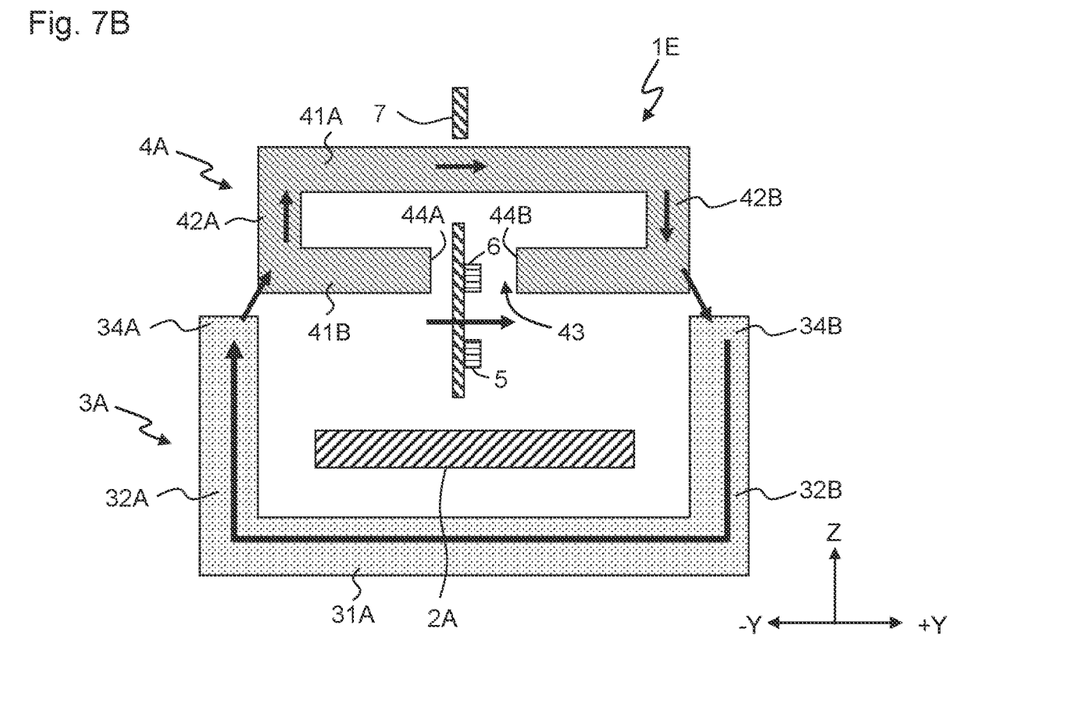

FIGS. 7A to 7B show another modification of the present embodiment. FIG. 7A is a perspective view of current sensor 1E according to the present modification, and FIG. 7B is a section view taken along line A-A in FIG. 7A. In the present modification, long side 31B of first magnetic circuit 3A of the embodiments described above that faces second magnetic circuit 4A is omitted. As viewed in the X direction, first magnetic circuit 3A consists of one long side 31A that extends in the Y direction and a pair of short sides 32A, 32B that extend in the Z direction and that are connected to both ends of long side 31A at right angles. Both ends of two short sides 32A, 32B opposite to long side 31A form both open ends 34A, 34B of first magnetic circuit 3A. As viewed in the X direction, in the same manner as the embodiments described above, second magnetic circuit 4A has a rectangular shape that has a pair of long sides 41A, 41B that extend in the Y direction and a pair of short sides 42A, 42B that extend in the Z direction. Void portion 43 is provided at the center of one of the long sides (long side 41B), and open ends 44A, 44B are positioned on both sides of void portion 43. When current flows in current line 2A, a rightward magnetic field that is induced by current line 2A dominates where first magnetic field detecting element 5 and second magnetic field detecting element 6 are provided. Therefore, the outputs of first magnetic field detecting element and second magnetic field detecting element 6 are positive. When current does not flow, a rightward magnetic field that is induced by the residual magnetization of first magnetic circuit 3A dominates where first magnetic field detecting element 5 is provided, and a leftward magnetic field that is induced by the residual magnetization of second magnetic circuit 4A dominates where second magnetic field detecting element 6 is provided. As a result, the output of first magnetic field detecting element 5 is positive, and the output of second magnetic field detecting element 6 is negative. Therefore, according to the present modification, the same effect as the embodiments described above can be achieved. In the present modification, both open ends 34A, 34B of first magnetic circuit 3A are preferably adjacent to second magnetic circuit 4A. As a result, when current flows, first magnetic circuit 3A and second magnetic circuit 4A are easily magnetically coupled to each other. The magnetic flux that exits open end 34A of first magnetic circuit 3A is efficiently sucked by second magnetic circuit 4A, and the magnetic flux that exits second magnetic circuit 4A is efficiently sucked by open end 34B of first magnetic circuit 3A, and residual magnetization is easily generated in second magnetic circuit 4A.

Figure 8A:
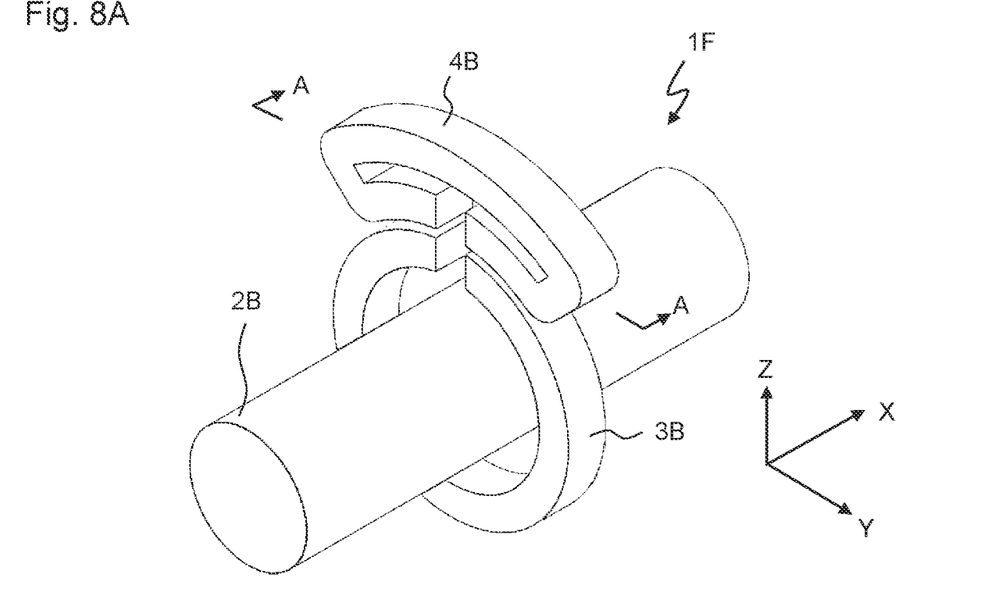
FIGS. 8A to 8B are schematic views of a current sensor according to a modification of the first embodiment.
Figure 8B:
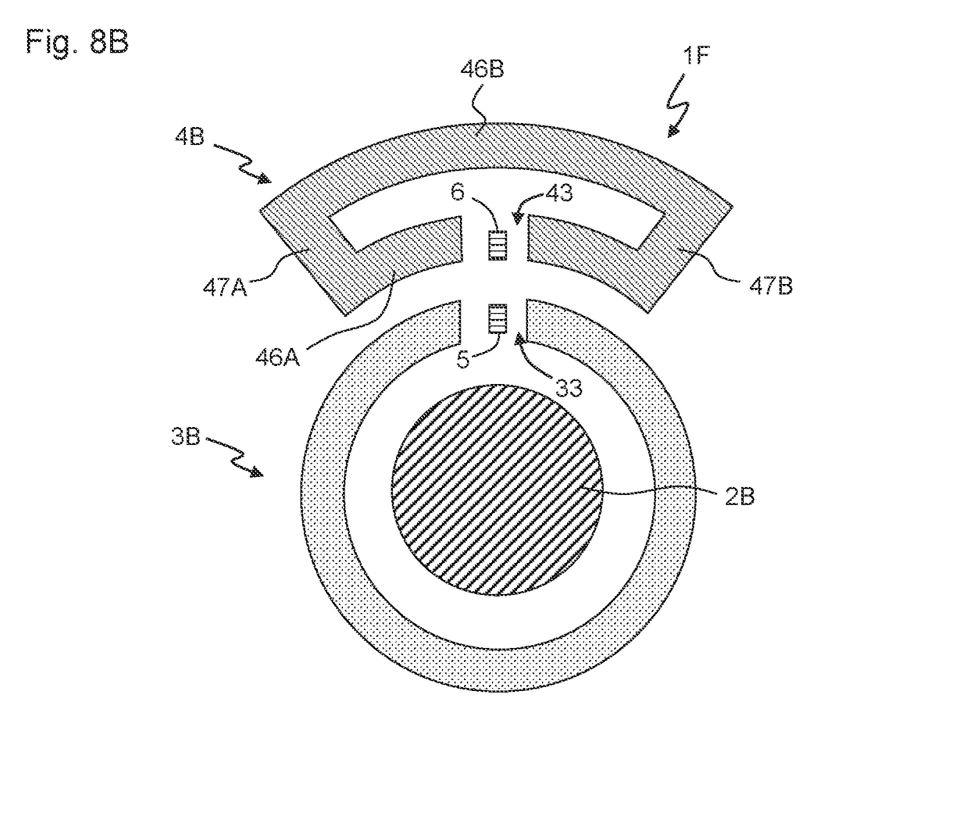

FIGS. 8A to 8B show another modification of the present embodiment. FIG. 8A is a perspective view of current sensor 1F according to the present modification, and FIG. 8B is a section view taken along line A-A in FIG. 8A. Current line 2B of the present modification has a circular section. First magnetic circuit 3B has a circular shape that conforms to current line 2B. Second magnetic circuit 4B has two arch-shaped portions 46A, 46B that conforms to first magnetic circuit 3B and two radial portions 47A, 47B that connect respective ends of arch-shaped portions 46A, 46B to each other. First magnetic circuit 3B and two arch-shaped portions 46A, 46B are concentric with current line 2B, with arch-shaped portion 46A being positioned inside of arch-shaped portion 46B. Void portion 33 is provided in first magnetic circuit 3B, and void portion 43 is provided in a portion of arch-shaped portion 46A that faces void portion 33. Due to this configuration, second magnetic circuit 4B is easily magnetized by first magnetic circuit 3B. Second magnetic circuit 4B is provided adjacent to first magnetic circuit 3B in the Z direction in the same manner as the embodiments described above. Current sensor 1F of the present modification works in the same manner as the embodiments described above.

Figure 9A:
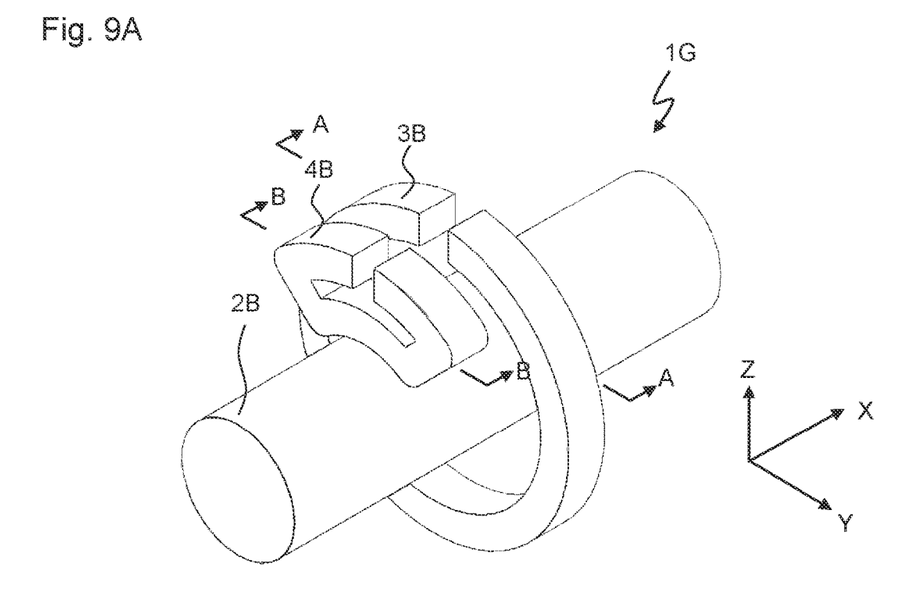
FIGS. 9A to 9C are schematic views of a current sensor according to a modification of the first embodiment.
Figure 9B:
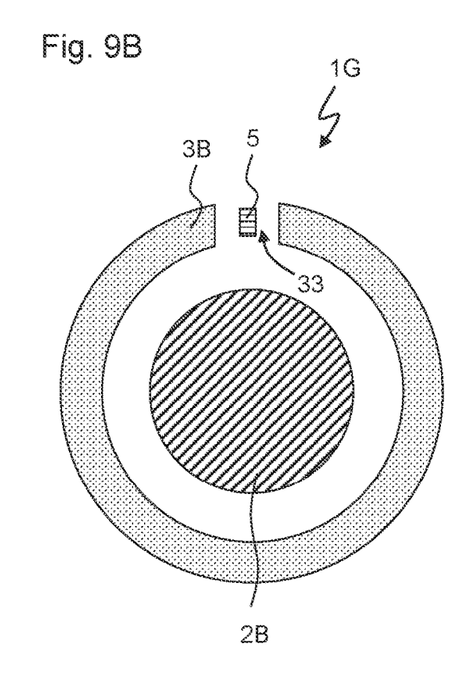
Figure 9C:
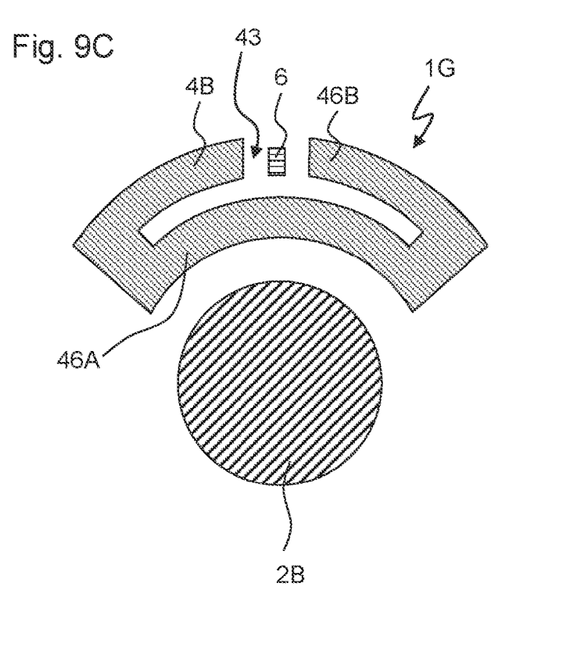

FIGS. 9A to 9C show another modification of the present embodiment. FIG. 9A is a perspective view of current sensor 1G according to the present modification, FIG. 9B is a section view taken along line A-A in FIG. 9A, and FIG. 9C is a section view taken along line B-B in FIG. 9A. According to the present modification, current line 2B has a circular section. First magnetic circuit 3B has the same shape as the modification shown in FIGS. 8A to 8B, but second magnetic circuit 4B is different from the modification shown in FIGS. 8A to 8B, and void portion 43 is provided in arch-shaped portion 46B. Furthermore, first magnetic circuit 3B and second magnetic circuit 4B are positioned in different Y-Z planes. The positional relationship between first magnetic circuit 3B and second magnetic circuit 4B is the same as the modification shown in FIGS. 4A to 4C. Current sensor 1G of the present modification works in the same manner as the modification shown in FIGS. 4A to 4C.

Second Embodiment

Figure 10A:
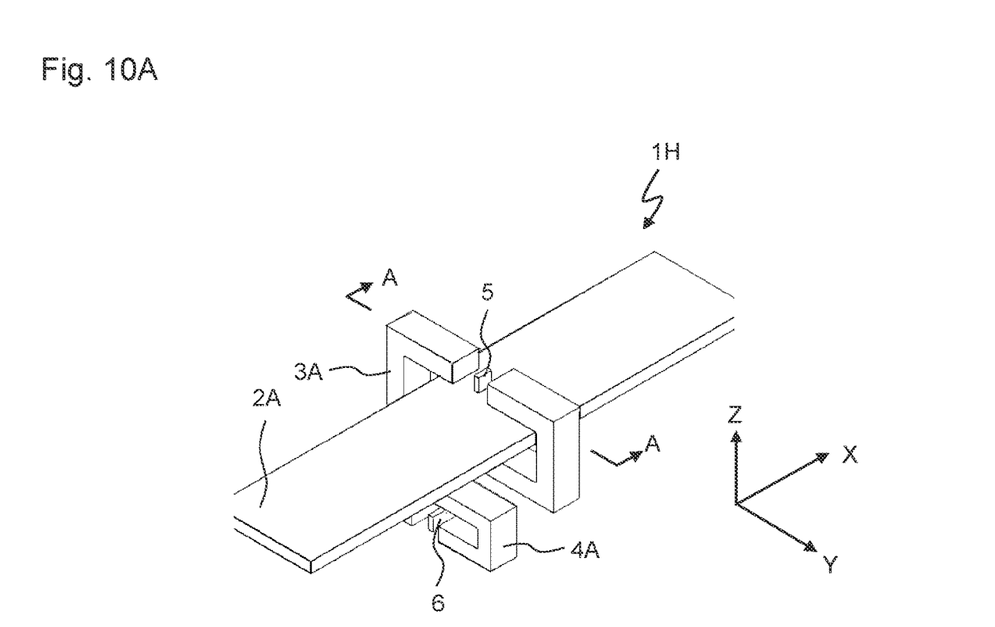
FIGS. 10A to 10B are schematic views of a current sensor according to a second embodiment.
Figure 10B:
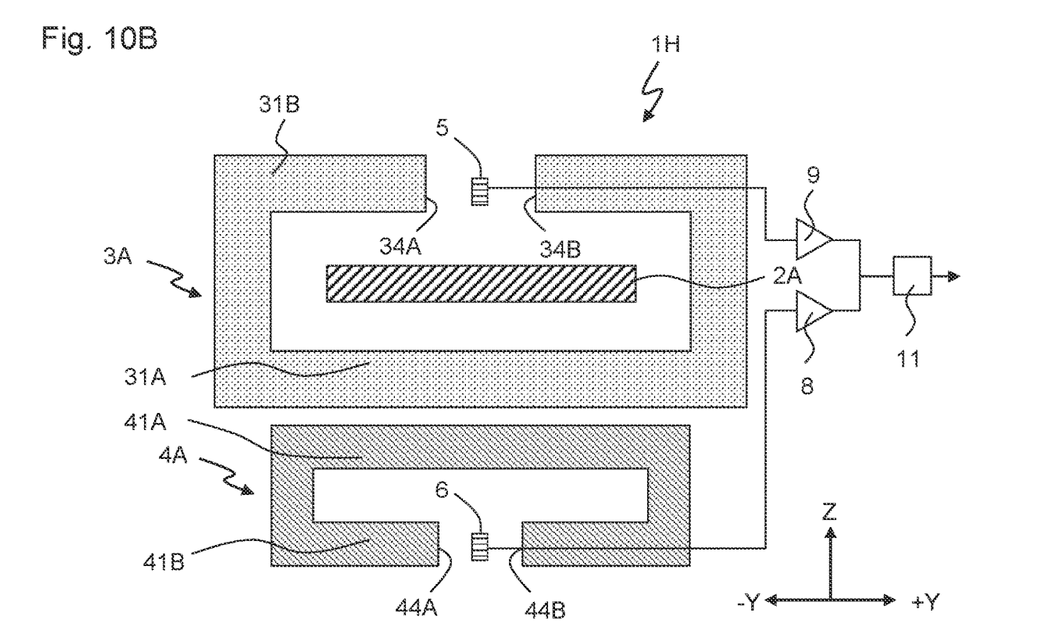
Figure 11A:
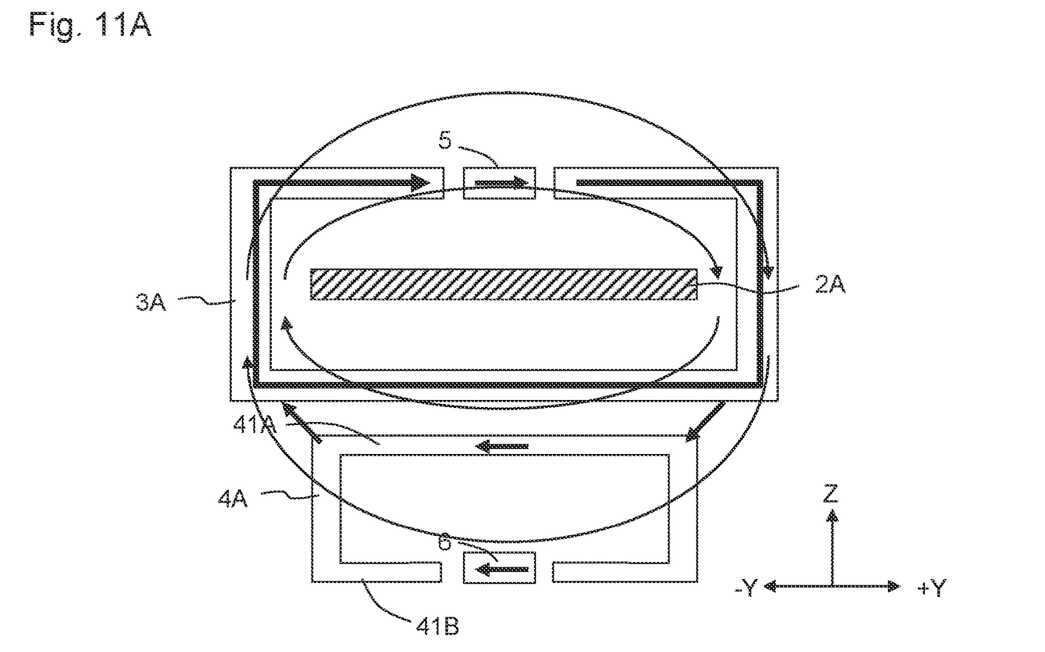
FIGS. 11A to 11B are conceptual views illustrating an external magnetic field that is applied to the current sensor shown in FIGS. 10A to 10B.
Figure 11B:
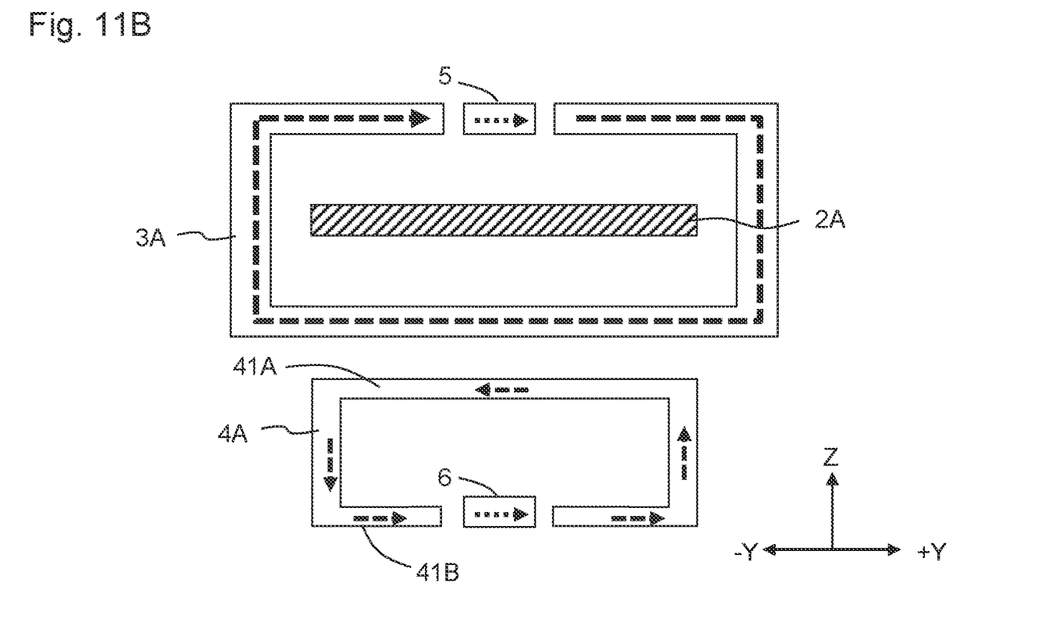

FIG. 10A is a perspective view of current sensor 1H according to the second embodiment, and FIG. 10B is a section view taken along line A-A in FIG. 10A. FIGS. 11A and 11B conceptually illustrate the external magnetic field that is applied to current sensor 1 when current flows in current line 2A and when current does not flow in current line 2A, respectively. First magnetic circuit 3A and second magnetic circuit 4A have the same shapes as the first embodiment. Second magnetic circuit 4A is positioned outside of first magnetic circuit 3A, and long side 41A of second magnetic circuit 4A faces long side 31A of first magnetic circuit 3A. Therefore, in the present embodiment, first magnetic field detecting element 5 and second magnetic field detecting element 6 are positioned on opposite sides with regard to current line 2A. The output of first magnetic field detecting element 5 and the output of second magnetic field detecting element 6 have the same polarity.

As shown in FIG. 11A, when current flows in current line 2A, a clockwise magnetic flux is formed around current line 2A. First magnetic circuit 3A is magnetized in the same manner as the first embodiment. The output of first magnetic field detecting element 5 is positive. Long side 41A of second magnetic circuit 4A that faces first magnetic circuit 3A is magnetized in the −Y direction by the magnetic field that is induced by current line 2A and by the leakage magnetic flux from first magnetic circuit 3A, but long side 41B is hardly magnetized. Second magnetic field detecting element 6A mainly receives a magnetic field that is induced by current line 2A. Therefore, the output of second magnetic field detecting element 6 is negative.

As shown by the dashed lines in FIG. 11B, when current does not flow in current line 2A, that is, when the electric current that flows in current line 2A is lost, residual magnetization is generated in the first and second magnetic circuits 3A, 4A. A magnetic field is generated in the +Y direction between both open ends 34A, 34B of first magnetic circuit 3A, and the output of first magnetic field detecting element 5 is still positive. On the other hand, second magnetic circuit 4A is magnetized counterclockwise by the residual magnetization of long side 41A, and a magnetic field is generated in the +Y direction between both open ends 44A, 44B. Therefore, the output of second magnetic field detecting element 6 is positive. In other words, regardless of whether or not current flows, a magnetic field is applied in the +Y direction to first magnetic field detecting element 5 that is positioned between both open ends 34A, 34B of first magnetic circuit 3A that surrounds current line 2A. On the other hand, at second magnetic field detecting element 6 between both open ends 44A, 44B of second magnetic circuit 4A that is positioned outside of current line 2A, the magnetic field when current flows and the magnetic field when current does not flow are directed in opposite directions.

However, unlike the first embodiment, when current does not flow, the magnetic field that is detected by first magnetic field detecting element 5 and the magnetic field that is detected by second magnetic field detecting element 6 have the same sign. On the other hand, when current flows, the magnetic field that is detected by first magnetic field detecting element 5 and the magnetic field that is detected by second magnetic field detecting element 6 are directed in opposite directions. Therefore, in the present embodiment, when current does not flow, by calculating a difference between the output of first magnetic field detecting element 5 and the output of second magnetic field detecting element 6 by means of subtractor 11, the hysteresis of first magnetic circuit 3A that is caused by the residual magnetization and the hysteresis of second magnetic circuit 4A that is caused by the residual magnetization can be cancelled out or reduced. Since a difference between the output of first magnetic field detecting element 5 and the output of second magnetic field detecting element 6 is obtained, the output of current sensor 1H can also be increased. As a result, it is possible to reduce the hysteresis while the S/N ratio is improved. In the present embodiment, the output of first magnetic field detecting element 5 and the output of second magnetic field detecting element 6 may have different polarities in the same manner as the modification of the first embodiment. In this case, current sensor 1H has means for calculating the sum of the output of first magnetic field detecting element 5 and the output of second magnetic field detecting element 6 (adder 10).

Third Embodiment

Figure 12A:
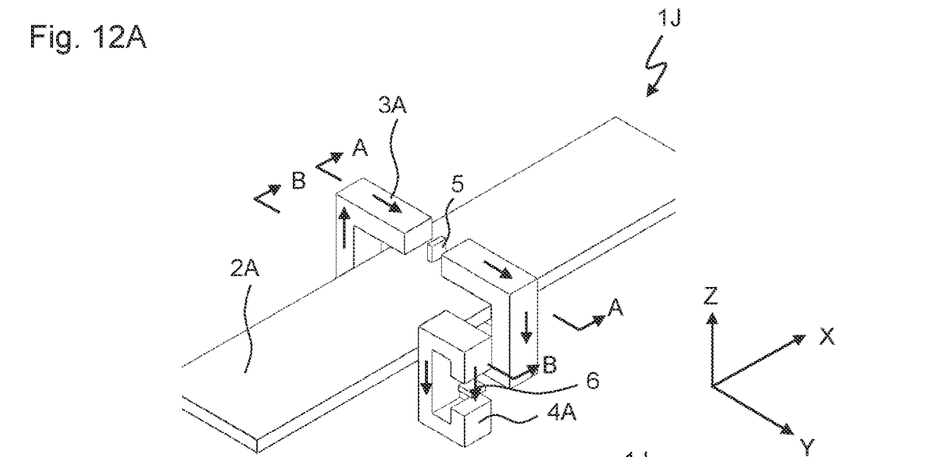
FIGS. 12A to 12C are schematic views of a current sensor according to a third embodiment.
Figure 12B:
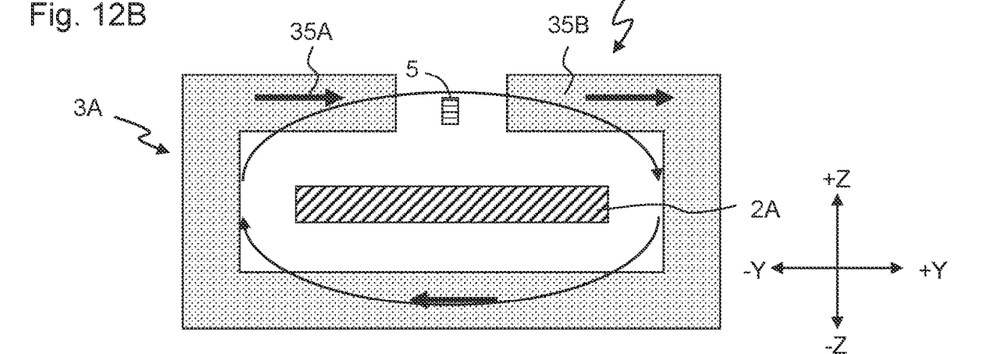
Figure 12C:
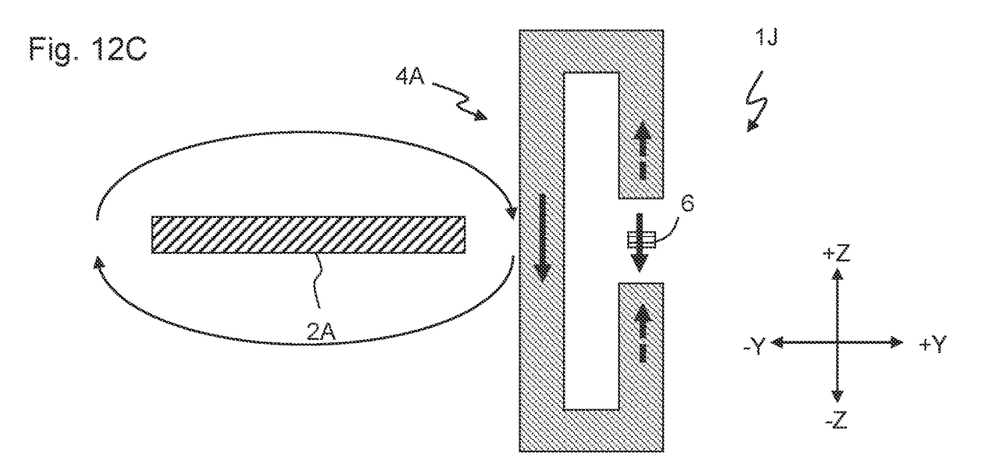

FIG. 12A is a perspective view of current sensor 1J according to the third embodiment, FIG. 12B is a section view taken along line A-A in FIG. 12A, and FIG. 12C is a section view taken along line B-B in FIG. 12A. First magnetic circuit 3A is the same as the modification shown in FIGS. 4A to 4C. On the other hand, second magnetic circuit 4A is rotated 90 degrees about current line 2A relative to second magnetic circuit 4A of the modification shown in FIGS. 4A to 4C. Accordingly, second magnetic field detecting element 6 is rotated about 90 degrees about current line 2A relative to second magnetic field detecting element 6 of the modification shown in FIGS. 4A to 4C. In other words, first magnetic field detecting element 5 and second magnetic field detecting element 6 are positioned such that they are rotated 90 degrees from each other about current line 2A. Therefore, first magnetic field detecting element 5 senses a magnetic field in the Y direction, and second magnetic field detecting element 6 senses a magnetic field in the Z direction. Furthermore, when defining the +Z direction and the −Z direction, as shown in FIGS. 12B, 12C, the polarity of the direction in which first magnetic field detecting element 5 senses a magnetic field is positive in the +Y direction, and the polarity of the direction in which second magnetic field detecting element 6 senses a magnetic field is positive in the −Z direction. That is, when a magnetic field is applied to magnetic field detecting element 5 and to second magnetic field detecting element 6 in the same rotational direction (clockwise in FIG. 12A), i.e., in the +Y direction an in the −Z direction, respectively, the output of first magnetic field detecting element and the output of second magnetic field detecting element 6 are positive. In other words, the output of first magnetic field detecting element 5 and the output of second magnetic field detecting element 6 have the same polarity with regard to the rotational direction of a magnetic field about current line 2A.

In the present embodiment, when current flows in current line 2A, a clockwise magnetic field that is induced by current line 2A dominates where first magnetic field detecting element 5 and second magnetic field detecting element 6 are provided. Therefore, the output of first magnetic field detecting element and the output of second magnetic field detecting element 6 are both positive. When current does not flow, a right ward (clockwise) magnetic field that is induced by the residual magnetization of first magnetic circuit 3A dominates where first magnetic field detecting element 5 is provided, and an upward (counterclockwise) magnetic field that is induced by the residual magnetization of second magnetic circuit 4A dominates where second magnetic field detecting element 6 is provided. As a result, the output of first magnetic field detecting element 5 is positive, but the output of second magnetic field detecting element 6 is negative. Therefore, according to the present embodiment, by providing means for calculating the sum of the output of first magnetic field detecting element 5 and the output of second magnetic field detecting element 6, the same effect as the embodiments described above can be achieved.

Conversely, in case that the polarity of the direction in which second magnetic field detecting element 6 senses a magnetic field is positive in the +Z direction, the output of second magnetic field detecting element 6 is negative when current flows in current line 2A, and the output of second magnetic field detecting element 6 is positive when current does not flow. The output of first magnetic field detecting element 5 and the output of second magnetic field detecting element 6 have different polarities with regard to the direction of a magnetic field about current line 2A. Therefore, by providing means for calculating a difference between the output of first magnetic field detecting element 5 and the output of second magnetic field detecting element 6, the same effect as the embodiments described above can be achieved.

As described above, each embodiment and each modification of the present invention comprises magnetic circuits 3A, 4A (3B, 4B) that are magnetized by electric current that flows in current line 2A (2B), first magnetic field detecting element 5 and second magnetic field detecting element 6. First magnetic field detecting element 5 is positioned where a magnetic field, when there is electric current that flows in current line 2A (2B), is directed in the same direction as a magnetic field that is caused by the residual magnetization of the magnetic circuit when there is no electric current that flows in current line 2A (2B). Second magnetic field detecting element 6 is positioned where a magnetic field, when there is electric current that flows in current line 2A (2B), is directed opposite to the direction of a magnetic field that is caused by the residual magnetization of the magnetic circuit when there is no electric current that flows in current line 2A (2B).

Although a certain preferred embodiment of the present invention has been shown and described in detail, it should be understood that various changes and modifications may be made without departing from the spirit or scope of the appended claims.

What is claimed is:

1. A current sensor comprising:
    a magnetic circuit that is magnetized by electric current;
    a first magnetic field detecting element that is positioned where a magnetic field, when the electric current is present, is directed in a same direction as a magnetic field that is caused by residual magnetization of the magnetic circuit when the electric current is not present; and
    a second magnetic field detecting element that is positioned where a magnetic field, when the electric current is present, is directed opposite to a direction of a magnetic field that is caused by residual magnetization of the magnetic circuit when the electric current is not present.

2. The current sensor according to claim 1, wherein the magnetic circuit has an open first magnetic circuit that surrounds an area through which electric current flows and an open second magnetic circuit that is positioned outside of the area,
    wherein the first magnetic field detecting element is positioned between both open ends of the first magnetic circuit, and the second magnetic field detecting element is positioned between both open ends of the second magnetic circuit.

3. The current sensor according to claim 2, wherein the first magnetic field detecting element and the second magnetic field detecting element are positioned on a same side of the area and have a same output polarity,
    further comprising means for calculating a sum of an output of the first magnetic field detecting element and an output of the second magnetic field detecting element.

4. The current sensor according to claim 2, wherein the first magnetic field detecting element and the second magnetic field detecting element are positioned on a same side of the area and have different output polarities,
    further comprising means for calculating a difference between an output of the first magnetic field detecting element and an output of the second magnetic field detecting element.

5. The current sensor according to claim 2, wherein the first magnetic field detecting element and the second magnetic field detecting element are positioned on opposite sides of the area and have a same output polarity,
    further comprising means for calculating a difference between an output of the first magnetic field detecting element and an output of the second magnetic field detecting element.

6. The current sensor according to claim 2, wherein the first magnetic field detecting element and the second magnetic field detecting element are positioned on opposite sides of the area and have different output polarities,
    further comprising means for calculating a sum of an output of the first magnetic field detecting element and an output of the second magnetic field detecting element.

7. The current sensor according to claim 2, wherein the first magnetic field detecting element and the second magnetic field detecting element are positioned such that they are rotated about 90 degrees from each other about the area, and have a same output polarity with regard to a direction of a magnetic field around the area,
    further comprising means for calculating a sum of an output of the first magnetic field detecting element and an output of the second magnetic field detecting element.

8. The current sensor according to claim 2, wherein the first magnetic field detecting element and the second magnetic field detecting element are positioned such that they are rotated about 90 degrees from each other about the area, and have different output polarities with regard to a direction of a magnetic field around the area, further comprising means for calculating a difference between an output of the first magnetic field detecting element and an output of the second magnetic field detecting element.

9. The current sensor according to claim 2, wherein the first magnetic circuit and the second magnetic circuit are positioned in a same plane that is perpendicular to a direction in which the area extends.

10. The current sensor according to claim 9, wherein the second magnetic circuit is positioned outside of the first magnetic circuit.

11. The current sensor according to claim 9, wherein the second magnetic circuit is positioned inside of the first magnetic circuit.

12. The current sensor according to claim 2, wherein the first magnetic circuit and the second magnetic circuit are positioned in different planes that are perpendicular to a direction in which the area extends.

13. The current sensor according to claim 2, wherein the first magnetic circuit is positioned in a plane that is perpendicular to a direction in which the area extends, and the second magnetic circuit is positioned in a plane that is parallel to a direction in which the area extends.

14. The current sensor according to claim 2, wherein each of the first magnetic circuit and the second magnetic circuit has a rectangular shape having a pair of long sides and a pair of short sides that are perpendicular to the long sides, and a void portion that forms the both open ends is provided at a center of one of the long sides.

15. The current sensor according to claim 2, wherein the first magnetic circuit consists of one long side and two short sides that are connected to both ends of the long side at right angles, and ends of the two short sides opposite to the long side form the both open ends,
wherein the second magnetic circuit has a rectangular shape having a pair of long sides and a pair of short sides that are perpendicular to the long sides, and a void portion that forms the both open ends is provided at a center of one of the long sides.

16. The current sensor according to claim 2, wherein each of the first magnetic circuit and the second magnetic circuit has a circular shape or an arc shape that conforms to the area.

17. The current sensor according to claim 2, wherein both end regions of the second magnetic circuit extend along both end regions of the first magnetic circuit.

18. The current sensor according to claim 2, wherein the area is a current line through which electric current flows.

19. The current sensor according to claim 1, wherein the first magnetic field detecting element and the second magnetic field detecting element are mounted on a common substrate.

20. The current sensor according to claim 1, further comprising a first amplifier that amplifies an output of the first magnetic field detecting element and a second amplifier that amplifies an output of the second magnetic field detecting element, wherein
gains of the first amplifier and the second amplifier are set such that an absolute value of the output of the first amplifier when the electric current is present and an absolute value of the output of the second amplifier when the electric current is not present are about a same level.

\* \* \* \* \*